United States Patent [19]
Thakur

[11] Patent Number: 5,561,612
[45] Date of Patent: Oct. 1, 1996

[54] CONTROL AND 3-DIMENSIONAL SIMULATION MODEL OF TEMPERATURE VARIATIONS IN A RAPID THERMAL PROCESSING MACHINE

[75] Inventor: Randhir P. S. Thakur, Boise, Id.

[73] Assignee: Micron Technology, Inc., Boise, Id.

[21] Appl. No.: 245,422

[22] Filed: May 18, 1994

[51] Int. Cl.$^6$ ........................................................ H05B 6/50
[52] U.S. Cl. .......................................... 364/557; 374/121
[58] Field of Search ................................. 374/121, 126, 374/132, 137; 392/418, 411, 419, 425; 219/121.6, 229, 492, 498, 508; 364/550, 557, 477

[56] References Cited

U.S. PATENT DOCUMENTS

| | | | |
|---|---|---|---|
| 4,927,226 | 5/1990 | Ortiz, Jr. ........................... | 219/121.6 |
| 4,948,937 | 8/1990 | Blank et al. ........................ | 219/121.6 |
| 4,956,538 | 9/1990 | Moslehi ............................. | 219/121.6 |
| 4,982,347 | 1/1991 | Rackerby et al. .................... | 364/477 |
| 5,098,199 | 3/1992 | Amith ............................... | 374/121 |
| 5,099,442 | 3/1992 | Furuta et al. ...................... | 364/557 |
| 5,151,871 | 9/1992 | Matsumura et al. .................. | 364/557 |
| 5,249,142 | 9/1993 | Shirakawa et al. ................... | 374/121 |
| 5,255,286 | 10/1993 | Moslehi et al. ..................... | 374/121 |
| 5,359,693 | 10/1994 | Nenyei et al. ...................... | 392/418 |
| 5,367,606 | 11/1994 | Moslehi et al. ..................... | 392/418 |
| 5,471,033 | 11/1995 | DiPaolo et al. ..................... | 364/557 |

*Primary Examiner*—Ellis B. Ramirez
*Assistant Examiner*—Thomas Peeso
*Attorney, Agent, or Firm*—Hopkins, Roden, Crockett, Hansen & Hoopes

[57] ABSTRACT

Temperature nonuniformity across a semiconductor wafer during both the transient and steady state of a typical rapid thermal processing (RTP) cycle has been a deterrent in using RTP in many VLSI unit processes. The present invention consists of a three-dimensional mathematical model to study the temperature variation across a wafer in an RTP oven for given lamp power settings, during both the transient and steady state of a typical thermal cycle and control a heating lamp back by a computer program. The simulation package has been written in FORTRAN, and the validity of various models have been checked by performing a series of oxidation experiments.

19 Claims, 13 Drawing Sheets

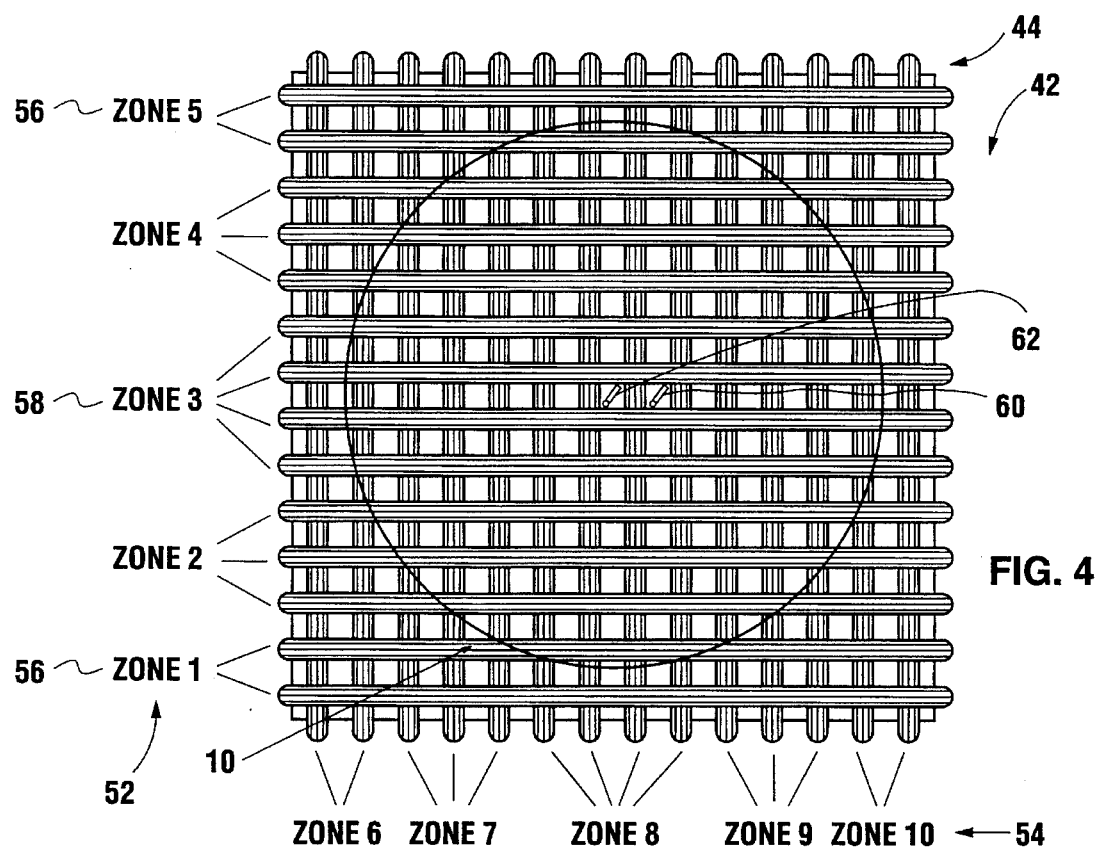
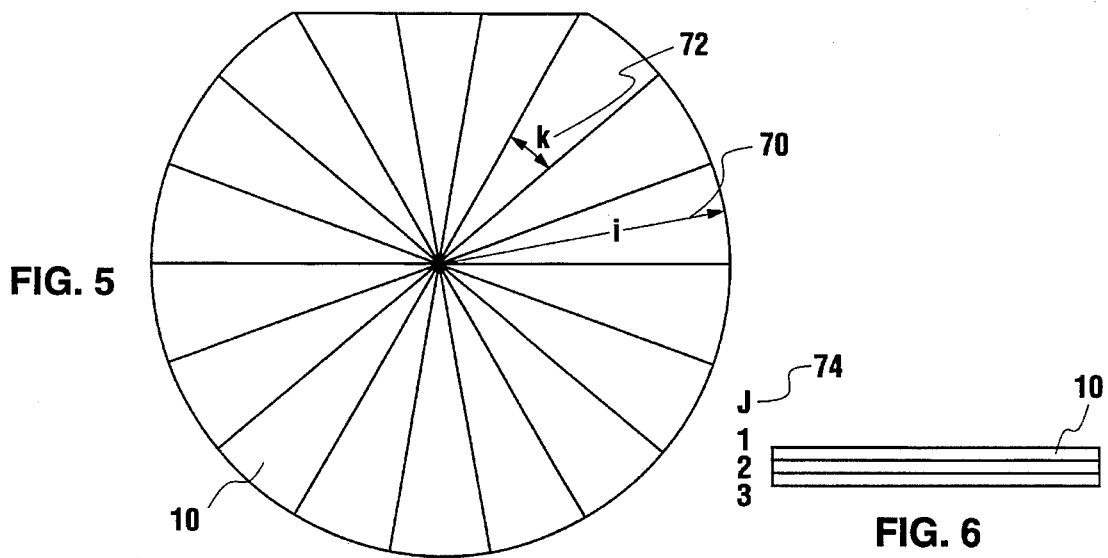

OPTIMIZED

OPTIMIZED

OPTIMIZED

CONTROL AND 3-DIMENSIONAL SIMULATION MODEL OF TEMPERATURE VARIATIONS IN A RAPID THERMAL PROCESSING MACHINE

TECHNICAL FIELD

This invention relates to a method and computer system that simulates and then controls a ULSI wafer-heating system.

BACKGROUND OF THE INVENTION

Rapid Thermal Processing (RTP) was started as a research technique some 25 years ago using pulsed laser beams. As the semiconductor industry is moving towards submicron devices, RTP is becoming a core technology step in the development and mass production of ultra-large system integration (ULSI) devices. Since their introduction more than a decade ago, RTP processors employing incoherent lamps are now the mainstay. Although complete single-wafer process flows, including many RTP steps (nitridation, oxidation, dopant activation, silicide formation, and ion implantation damage removal), have been demonstrated in sub 0.5 mm CMOS devices, a surprisingly small minority is used in a full production environment. Even then, this is mainly limited to titanium (Ti) sintering and annealing, where any annealing system is successful as long as the oxygen content is kept below 5–10 ppm in a 1 atmosphere ambient.

The main obstacles for full acceptance of RTP into manufacturing are still temperature reproducibility and uniformity during all processing, i.e., in the dynamic ramp up, ramp down, and steady state of the thermal cycle, during which films are annealed or formed.

The main distinction between RTP and conventional furnace processing is that the former is a cold wall process, i.e., the lamp energy is primarily used to heat the wafer and the thermal mass of the heated system is low. Once the wafer attains the desired processing temperature, energy is required only to maintain the wafer at this processing temperature by compensating for the energy losses which take place by convection (free as well as forced convection) and radiation, as the wafer is exposed to the cold ambient. If this heat requirement is not met on any region of the wafer either during ramp up or steady state period, temperature nonuniformity is observed across the wafer.

In rapid thermal processing (RTP), the wafer is heated on the planar surfaces by lamp radiation and emits radiation from all surfaces, i.e., from top surface, bottom surface, and the edge of the wafer. The temperature nonuniformity observed across the wafer during RTP in a typical RTP chamber is due to the following reasons:

a) Nonuniform illumination across the wafer, i.e., the total optical flux (primary light from the lamps as well as the back-reflected radiation from the reflector) incident towards the edge of the wafer may be greater or less than that incident on the center of the wafer due to the wafer geometry in relation to the system geometry. This would result in the edge being either hotter or cooler, as the case may be.

b) The back-reflection of the radiation emitted by the wafer may be different for different regions of the wafer, i.e., more at the center and less at the edge of the wafer.

c) Patterning of the wafer with a material having thermophysical properties (emissivity, thermal conductivity, and specific heat capacity) considerably different from the substrate wafer creates local temperature nonuniformities across the surface even if the system uniformity on blank wafers is perfect. This is severe if the pattern size is larger than the diffusion length for lateral heat diffusion in silicon at the processing temperature.

d) As mentioned above, the edge of the wafer loses more energy by radiation as it has a larger surface area and is exposed directly to the cold ambient chamber walls 18 and not to the lamps. This energy loss from the edge is the primary cause for the observed temperature nonuniformity across the wafer. If this is not compensated by providing additional lamp radiation at the edge, the temperature nonuniformity across the wafer will manifest itself in the form of both surface as well as bulk defects, e.g., dislocations, slip lines, and wafer warpage.

The convection losses and thermal conduction within the wafer are the dominant form of heat transfer mechanisms for processing temperatures less than 800° C. Convective heat transfer increases across the wafer due to the presence of gas flow recirculation cells and increased gas mixing as one moves closer to the edge. Above 800° C., radiation loss is the major mode of heat transfer.

Hence, the temperature nonuniformity observed across the wafer during transient ramp up may be much different from that observed during steady state as the primary heat loss mechanism in both the stages are much different. This means any technique to control the temperature nonuniformity across the wafer during the steady state should be flexible to control it during transient state, i.e., ramp up and ramp down.

In general, a typical RTP system contains three major parts (see FIG. 1A): (a) a high-power lamp system 22 heating the wafer 10; (b) a chamber 18 in which the wafer 10 is contained; and (c) a pyrometer 20 to measure the wafer temperature. The lamp system can be either a set of tungsten-halogen lamps or a high-power arc lamp with a reflector. The chamber is generally a quartz chamber. In all cases, the lamps are separated from the wafer with a quartz window 24. The pyrometer 20 measures the radiation that is emitted from the backside 14 of the wafer and converts this into wafer temperature. Other non-invasive temperature measurement techniques based on thermal expansion of the wafer, laser interferometry, and acoustic interference are being developed to accurately measure the temperature. The present model can also be applied for concentric lamp configurations and systems that use single-side heating.

Other features of this prior art chemical RTP vapor deposition (CVD) system include the quartz wafer holder 26, the process gas conduits 28, and the reflector 30. However, since the temperature nonuniformity is observed across the wafer during transient and steady state, most of the prior research has been towards improving the heating lamp system and reflector design to compensate for the additional radiation loss at the edge of the wafer. Researchers have come up with lamp system designs which can heat the edge of the wafer more than the other regions. This type of design is called lamp contouring, i.e., outer lamps being operated at significantly higher power than the inner ones. Obviously, this means using multiple lamps to heat the wafer. Researchers suggest that the sharper the increase in heat flux at the edge of the wafer the better the uniformity. This can be achieved either by suitable lamp design or reflector geometry.

The heating lamp system comes in four basic geometries: the line source, the square source, the hexagonal source, and the ring source. FIG. 1B is an example of the ring source lamp system, where the lamp bank consists of an outer ting, middle ting, and an inner lamp or ring of lamps. Most systems use line-symmetrical components, i.e., linear double-ended tubes, usually in some cross-lamp array (square symmetry source) of lamp banks below and/or above the chamber. Heating lamps are also used to form concentrically arranged optical flux rings and hexagons for uniform flood heating. A typical hexagonal lamp panel contains 109 water-cooled, cylindrical, light pipes, each with a W-halogen bulb lamp inside. One lamp is in the center and others are in six hexagonal zones around it. A fully ring-shaped symmetry is offered by a resistance-heated, silicon carbide bell-jar, which serves as the heat source as well as the reaction chamber. It is obvious that the pseudo-ring or the hexagonal symmetry is the most complicated yet the most promising, as compared to line and square sources, which are not compatible with the circular wafer shape.

Reflector designs, in general, have the same general geometries as the lamps and/or the chamber. Often the reflector is conformal to, or is, the chamber walls. In that case, most designs make use of a gradient in the reflectivity of the reflector. One way is to make reflector more reflective at the edge. The disadvantage of this design is that it addresses temperature nonuniformity issue only during one phase of the processing cycle, i.e., steady state. It doesn't correct for edge effects during ramp up as the edge effects are considerably different from that during steady state. The temperature nonuniformity at the very end of the ramp up thermal cycle is the one which manifests itself in the form of wafer warpage and slip. Adaptive multizone heat control is a better solution.

Another alternative to compensate for the edge effect during steady state is to provide a polysilicon guard ring assembly 32 (slip-free ring) around the wafer as in FIG. 2 which is heated along with the wafer 10. This avoids the edge of the wafer being exposed to cold ambient during the processing. So, in effect, the wafer 10 is extended up to the ring 34 and the actual slip might take place in the ring. The wafer 10 is placed on the guard pins 36 which are supported by the ring tray 38. The actual temperature reached by the guard ring could be less or more compared to the wafer depending on the surface structure (roughness, emissivity), doping concentration of the ring, and the ring/heating lamp geometry. However, the temperature nonuniformity problem is not addressed fully, as the wafer edge would now cool more slowly compared to the center during ramp down, resulting in temperature nonuniformities.

Once the emissivity, wafer pattern, thermophysical, and thermochemical properties are entered into the main program, it will give the intensity of various zones that will be required for achieving maximum uniformity across the wafer.

In a typical prior art process, without the computer simulation before experimental trial, it would be necessary to prepare a heat lamp ramp up and steady state energy program using various lamp bank combinations and then perform experiments on multiple wafers until a successful wafer anneal was achieved. Successful being one that did not have nonuniformities that create wafer dislocations, slip lines, or warpage. The unsuccessful experiments created wasted wafers, and expensive time was lost.

SUMMARY OF THE INVENTION

A rapid thermal process for presetting and controlling a lamp heating system used to heat a semiconductor wafer, the process comprising:

initializing input data to a computer main program, said data comprising element nodes, element sectors, time intervals, and initial wafer temperatures;

inputting a thermal conductivity for a wafer volume element as a function of time;

inputting a plurality of coefficients used in a differential heat equation for a wafer temperature;

defining system variable parameters and calculating heat losses;

calculating a temperature for each wafer volume element versus time;

writing an X and Y coordinate and temperature versus time for each volume element to a printer/plotter and to a heat controller;

individually controlling a power level to multiple lamp banks to provide a predetermined temperature ramp rate;

monitoring a wafer center temperature with a temperature sensor;

providing a temperature feedback means from the temperature sensor to the computer heat controller and the computer main program, thereby quickly and accurately controlling the wafer temperature to a temperature above room temperature.

This invention also discloses a system for presetting and controlling a heat lamp input to heat a semiconductor wafer, the system comprising:

a main computer and computer program having input data;

a printer/plotter having an input signal from the main computer;

a heat controller having an input signal from the main computer;

a multiple zoned lamp bank having a power input from the heat controller;

temperature indicator having temperature input from the wafer;

a temperature feedback from the temperature indicator to the heat controller and main computer;

a temperature feedback means to feed back temperature data to the heat controller and main computer, wherein the main computer outputs time, temperature, wafer X and Y coordinates, and heat intensity to preset and control lamp bank power input.

Other objects, advantages, and capabilities of the present invention will become more apparent as the description proceeds.

BRIEF DESCRIPTION OF THE DRAWINGS

FIG. 4 is a plan view of the multiple zone heating lamps used in the present inventive process.

FIG. 5 is a plan view of a wafer showing the finite radial elements used in the present process.

FIG. 6 is a side elevation of the wafer showing the thickness elements used in the present process.

DETAILED DESCRIPTION OF THE INVENTION

Figure 1B:
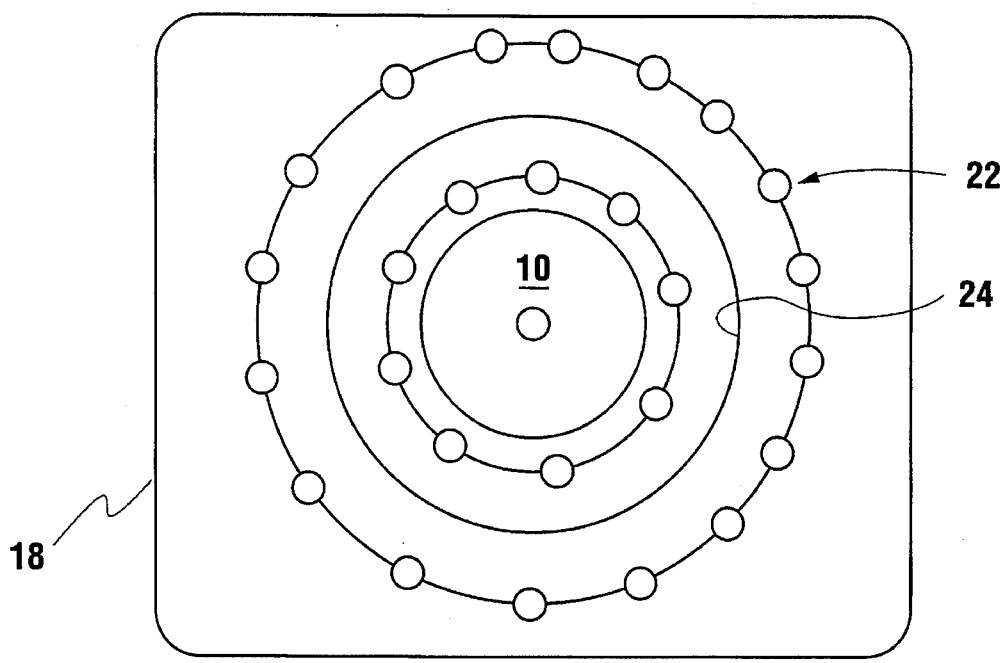
FIG. 1B is a plan view of the RTP chamber taken through lines 1B—1B of FIG. 1A.
Figure 1A:
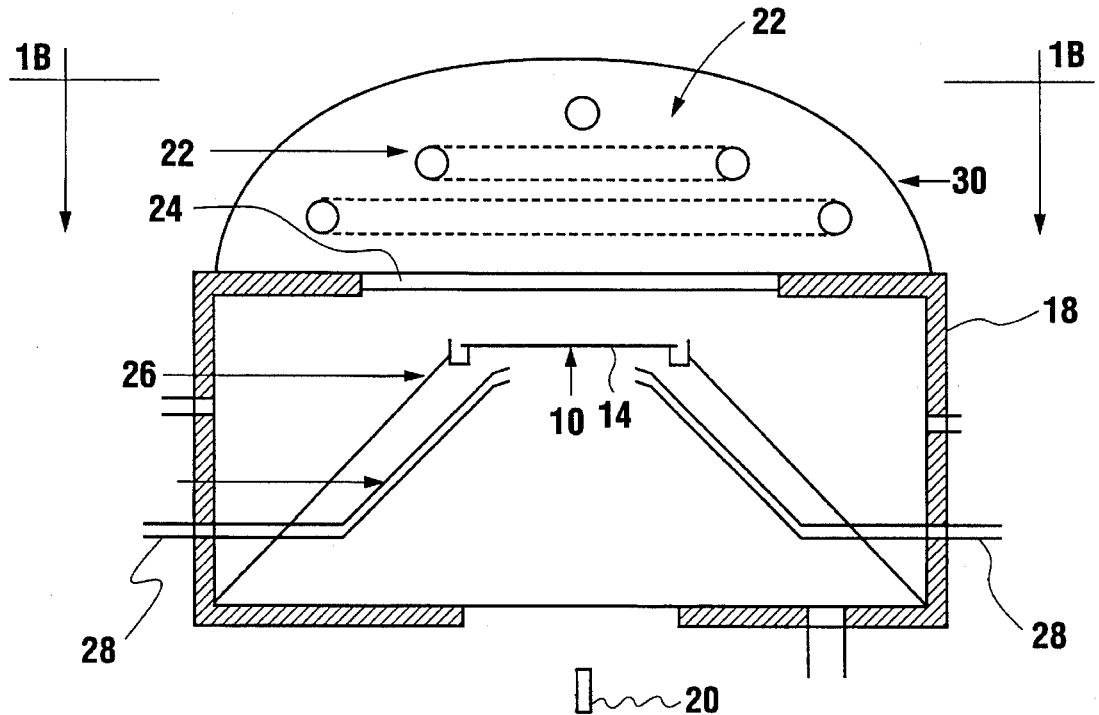
FIG. 1A is a cross-section view of one type of a prior art rapid thermal processing (RTP) chamber.
Figure 2:
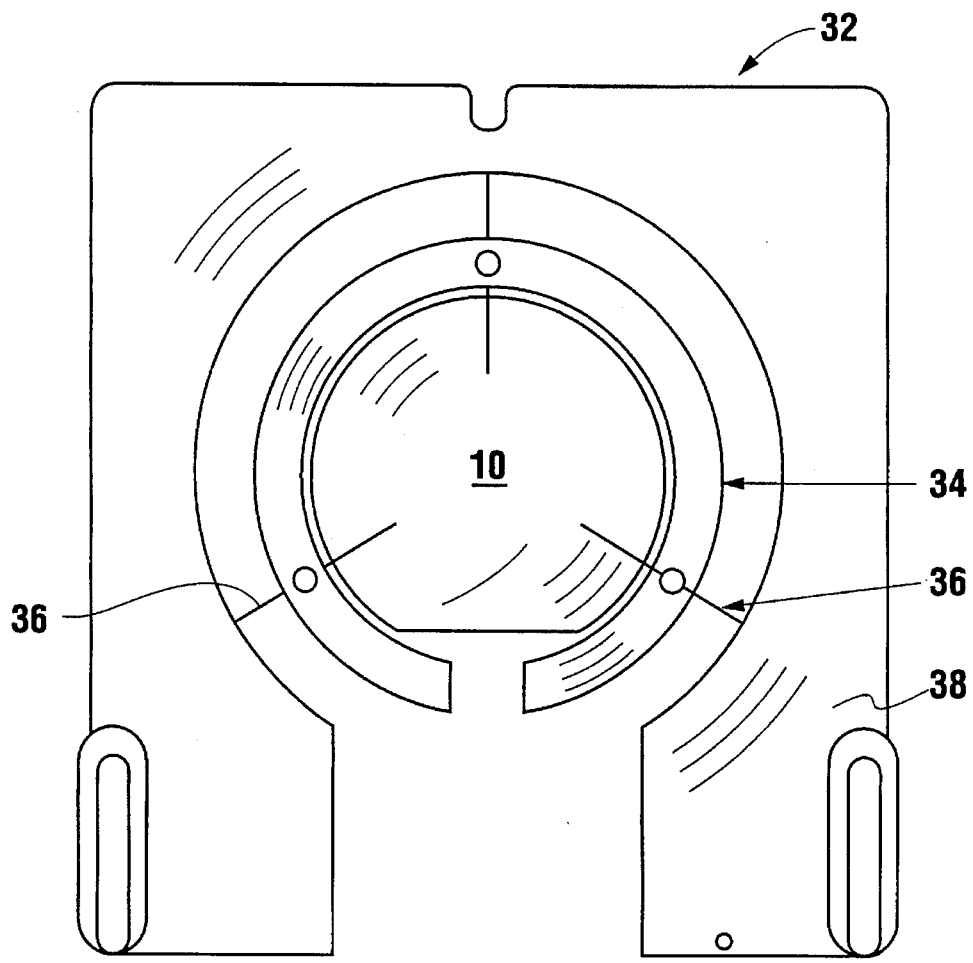
FIG. 2 is a plan view of a typical prior art polysilicon guard ring and wafer tray.
Figure 3:
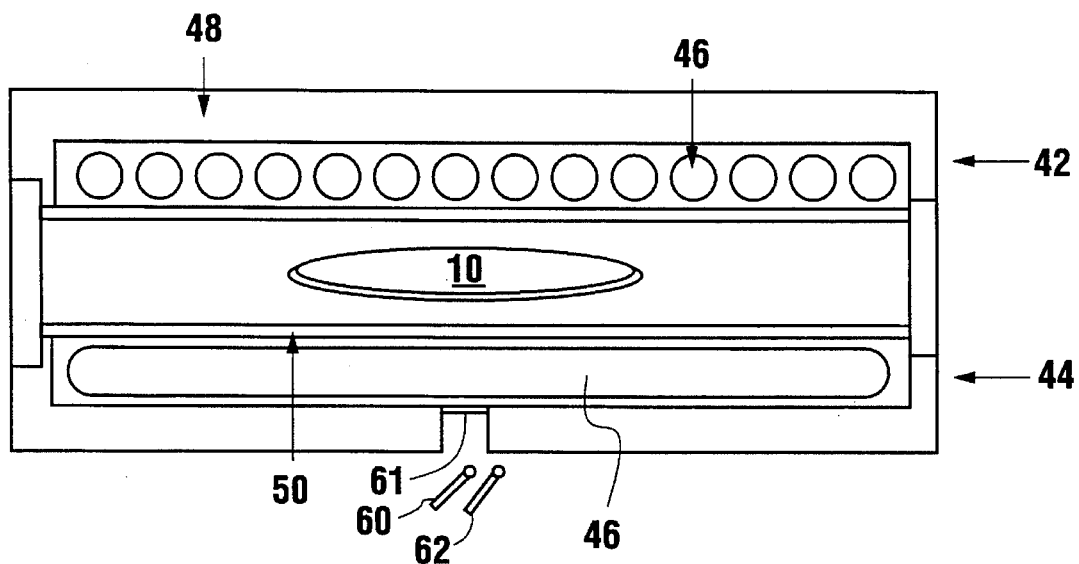
FIG. 3 is a cross-section view of a typical prior art rapid thermal processing (RTP) oven used in the present inventive process.

A typical rapid thermal process (RTP) makes use of a linear W-halogen lamp system to heat both the top and the bottom surface of the wafer 10 as in FIG. 3 as one particular case. The lamps are arranged in two banks, a top 42 and bottom one 44. Each bank consists of 14 lamps 46 and both the banks are arranged perpendicular to each other as shown in FIG. 3 and FIG. 4. Each lamp 46 has a lighted length of 10", and the total lighting area is 11.2×11.2". The chamber wall 48 has a gold reflecting coating. The wafer sets within a quartz chamber 50 which is transparent to the radiation whose wavelength falls between 0.5 and 4 microns. The electromagnetic spectrum of the W-halogen lamps is in this range. The system can provide a ramp rate between 1 and 250° C. per second. The maximum processing temperature which can be carried out is slightly above 1200° C.

Referring to FIG. 4, the 14 lamps in each bank are arranged essentially in the form of five zones each 52 and 54. The outer zones 56 and the central zone 58 have two lamps and four lamps, respectively. The intermediate zones have three lamps each, and there are ten zones in total. The power to each zone will be independently controlled to compensate for edge effects.

The chamber is capable of processing both 6" and 8" wafers. The 6" wafer sets well within the central three zones (2, 3, 4, 7, 8, 9) and the 8" wafer 10 sets completely overlapping the central three zones (FIG. 4). Consequently, the heat transfer mechanisms are quite different for the two types of wafers as the 6" wafer edge would receive more radiation compared to the 8" wafer edge, as it is exposed to more heating area.

The temperature of the wafer is monitored using a pyrometer 60 which sees the backside of the wafer through a 0.15 mm thin quartz window 61 (FIG. 3). The window is thin enough to transmit most of the radiation. An additional pyrometer 62 of a different wavelength is used to measure radiation from the quartz chamber 50 and is also used in calculation of actual wafer temperature. The window is maintained clean all the times to avoid temperature errors.

The equipment is capable of processing the wafers in both the open loop (constant heat intensity) and closed loop configuration (variable heat and linear temperature). There is an inlet for gas flow in the chamber. The gases flow from lamp zone 5 towards lamp zone 1.

As mentioned above, this equipment has a heating area which is larger than the wafer area (both in the case of 6" and 8" wafers). This design, in effect, is to facilitate lamp heat contouring, i.e., more flux on the edge compared to the center of the wafer to account for additional edge loss. The heat flux profile over the wafer can, therefore, be controlled by controlling the power to the individual zones. However, if all the zones are operated at the same power level, the flux provided to the edge is found to be more than required to compensate for the additional edge loss. This causes the edge to be hotter than the center of the wafer during the entire cycle of processing. Consequently, the power of the outer zones has to be suitably controlled during different parts of the thermal cycle to account for this edge effects.

As the radiation loss is proportional to the fourth power of the temperature, the required power setting would be different for different processing set point temperatures. Control also depends on the type of gas being used for processing and gas velocity. Nitrogen and argon don't absorb any radiation whose wavelength lies between 1 and 4 microns, whereas other gases (e.g., oxygen, silane, ammonia, etc.) do absorb radiation emitted from lamps of this wavelength. Also, depending on the gas flow rate, it is possible to have both free and forced convection.

As can be expected, the temperature distribution might not be symmetric even with symmetric power distribution to the lamps, since the gas enters cold at the inlet near zone 5 and progressively gets hotter as it flows towards the outlet near zone 1.

It is therefor important to understand the heat transfer mechanisms in this equipment and devise a low-order simulation program which can predict the temperature distribution across a 6" wafer for a given or variable power setting to the lamps. Obviously, this would be useful only if it could predict temperature distribution across both patterned and unpatterned wafers as the absorption and emission characteristics are much different for these two types of wafers. The final objective of the simulation is to calculate the required power setting to be applied to the various zones for minimal temperature nonuniformity during a typical processing cycle. Again, this might depend on the processing temperature, processing time, ramp rate, and the type of process. FIG. 5 and FIG. 6 illustrate the various nodes that make up the total volume of the wafer and are used in the mathematical models for determining temperatures. The i term 70 is the radial distance, the k term 72 is the angular sector, and the j term 74 is the wafer thickness nodes.

Mathematical modeling of heat transfer processes in RTP chamber and simulation program(s).

Figure 7:
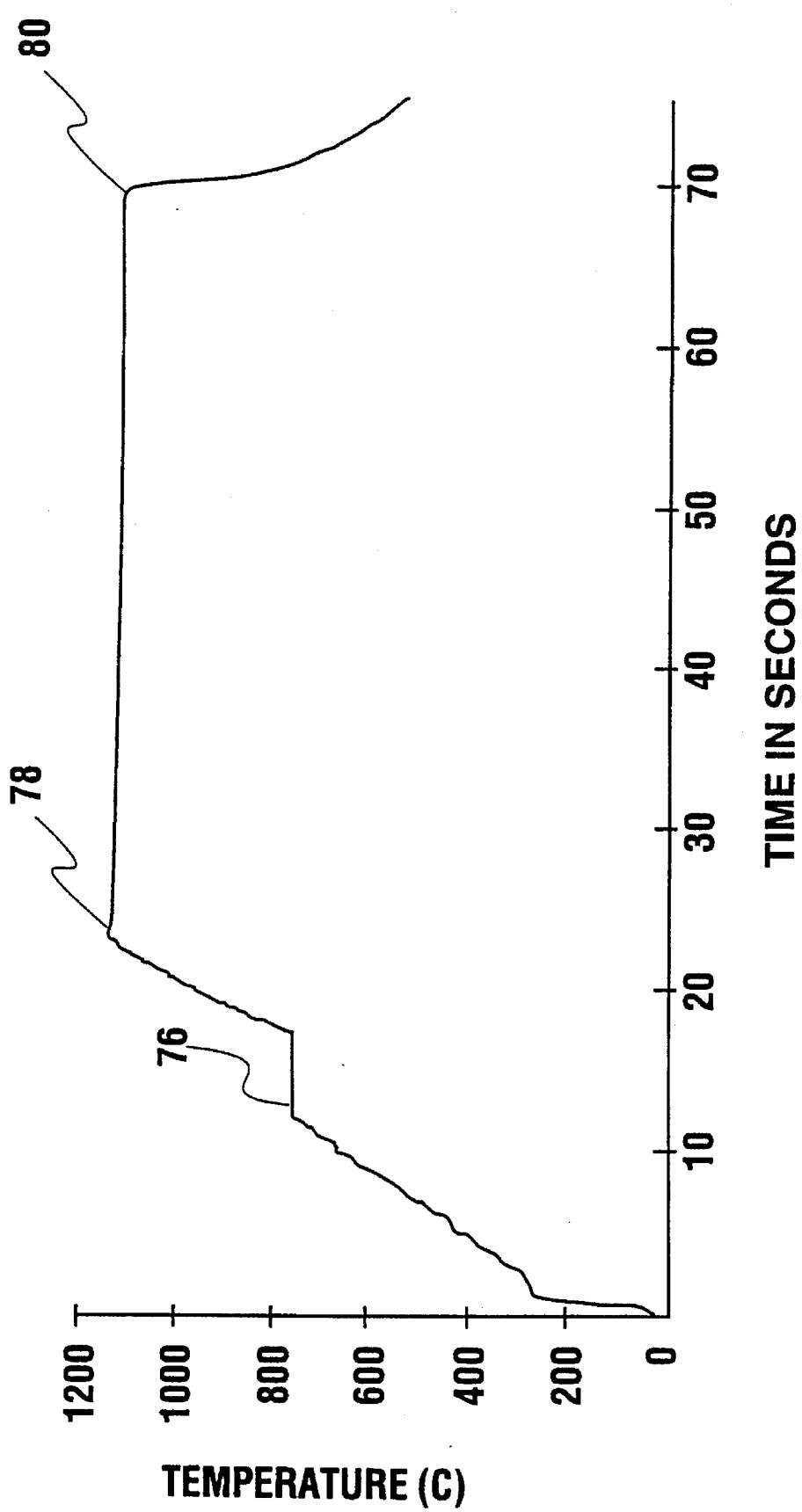
FIG. 7 is a graph of temperature versus time of a wafer during a typical RTP cycle.

The temperature of the wafer during an ideal RTP cycle varies as a function of time as show in FIG. 7. FIG. 7 is a plot of temperature of the wafer using a temperature increase rate, i.e., ramp rate, of 60° C. per second and having a short steady-state rate at about 13 seconds as at 76 at 750° C. and a second steady rate at 22 seconds as at 78 at about 1100° C. The thermal relaxation period then lasts from 22 seconds to 68 seconds as at 80. Any point of the wafer at any stage of the thermal cycle can be described mathematically by EQ. (1):

$$m_i c_p (dT_i/dt) = q_i^{rad} + q_i^{conv} + q_i^{cond} \quad \text{EQ. (1)}$$

where the term on the left side refers to the temperature rise of the wafer, where $m_i$=mass, $c_p$=specific heat capacity, and $q_i^{rad}$, $q_i^{conv}$, and $q_i^{cond}$ refers to radiation heat loss, convection heat loss, and thermal relaxation due to conduction, respectively. Mathematically, $$q_i^{rad}=q_i^{abs}-\epsilon\sigma A_i T_i^4 \qquad \text{EQ. (2)}$$

$$q_i^{conv}=h_i A_i(T_i-T_{gas}) \qquad \text{EQ. (3)}$$

$$q_i^{cond}=ka(dT_i/dr) \qquad \text{EQ. (4)}$$

where $q_i^{abs}$ refers to radiation absorbed from the lamp, reflector, and the walls of the chamber if they are reflective. It also includes second order contributions coming from components such as transparent windows which get gradually heated up over longer periods of time.

$\epsilon$ is emissivity of the material which might vary from point to point depending on the surface treatment of the wafer;

$\sigma$ is the Stefans-Boltzmann constant=$5.67\times10^{-8}$ Wm$^{-2}$K$^{-4}$;

$A_i$ is the area exposed to the process ambient;

$T_i$ is the temperature at the local volume;

$T_{gas}$ is the temperature of the ambient gas; and $h_i$ is the convection heat transfer coefficient of the gas, which depends on the pressure and gas flow characteristics and often needs to be experimentally calculated.

The EQ. (1) can be rewritten as:

$$q_i^{abs}=m_i c_p(dT_i/dt)+\epsilon\sigma A_i T_i^4+h_i A_i(T_i-T_{gas})-ka(dT_i/dr) \qquad \text{EQ. (5)}$$

$$q_{ramp}(t)=m_i c_p(dT_i/dt) \qquad \text{EQ. (6a)}$$

$$q_{stat}(t)=\epsilon\sigma A_i T_i^4+h_i A_i(T_i-T_{gas})-ka(dT_i/dr) \qquad \text{EQ. (6b)}$$

The EQ. (6a) term "$q_{ramp}(t)$" represents that portion of the radiation intensity used for heating up the wafer. The EQ. (6b) term "$q_{stat}(t)$" represents that radiation portion required to compensate the heat losses at that temperature. The radiation loss which is given by Stefans-Boltzmann's $T^4$-law usually dominates. When $q_i^{abs}$ is greater than $q_{stat}(t)$, the component $q_{ramp}(t)$ is positive, i.e., the temperature is increasing; if $q_i^{abs}=q_{stat}(t)$, no temperature changes occur; and if $q_i^{abs}<q_{stat}(t)$, the temperature is decreasing. The maximum rate is limited because $q_i^{abs}$ can never be negative.

There are two methods for increasing wafer temperature. In a first method, the heat lamp is assumed to operate in the constant intensity mode, i.e., $q^{abs}$ is an independent variable which depends on the lamp power and the amount of re-absorbed heat radiation by the wafer itself. It is an explicit function of time (i.e., $q^{abs}=q^{abs}(t)$) if there is no re-absorption. The momentary wafer temperature is a response to this intensity and implies the value of $q_{stat}(T(t))$. The ramp rate can be calculated from the momentary temperature from EQ. (6a) and EQ. (6b). Here, $q_i^{abs}$=constant is assumed. At t=0, T(0)=27° C. is assumed. Since there are no losses also, no intensity is required for compensation $q_{stat}(0)$=0. Therefore, all the intensity is used to increase the wafer temperature. As the temperature increases, heat losses occur and part of the intensity is consumed for compensation. Accordingly, less intensity is left for ramping. During the stationary state (which is reached asymptotically), all the intensity is necessary for compensating heat losses and nothing used for ramping.

In a second method, a linear temperature increase mode is programmed, i.e., the temperature-time cycle is pre-set and the intensity is varied to achieve this cycle. In this case, the temperature dependence of the intensity is given implicitly by the temperature dependence of ramp rate $\alpha$ is an unsteady function of t, i.e., the temperature is increased with a constant rate $\alpha$ until the steady-state temperature is reached, then $\alpha$ becomes zero.

Therefore, the T-t cycle can be split in two parts:

the ramp phase with $\alpha\neq 0$; and the steady-state temperature with $\alpha=0$.

When the temperature is increasing, $q_i^{abs}$ must increase too, because it represents that part of the intensity which is needed to maintain a momentary temperature level. In order to achieve ramping with a constant rate, a constant amount of intensity given by EQ. (6a) must be added to this component. During steady state, $q_i^{abs}$ is given only $q_{stat}(t)$. For typical ramp rates of 200 K/s, for example, $q_{ramp}(t)$ is an order of magnitude higher than $q_{stat}(t)$ around 600° C. and of the same order as $q_{stat}(t)$ above 1100° C.

EQ. (5) essentially represents the relation between the ramp rate, the actual temperature, and the absorbed intensity. The absorbed intensity, however, is a quantity which is not directly measurable. Only the lamp intensity is primarily given. Therefore, the lamp intensity of the considered RTP system has to be related to the absorbed intensity. However, it is difficult to determine this relation because it depends on the special layer structure and the spectrum of the incident light which in many cases are not known in detail. This is required only if the RTP system is operated in the constant intensity linear mode. RTP systems, however, are usually operated in the temperature mode by performing a closed feedback loop temperature control by a calibrated optical pyrometer. Although the incident intensity differs from the absorbed intensity, only the absorbed intensity influences the closed loop control to match the actual temperature profile to the desired one. Therefore, the absorption characteristics need to be known.

This invention consists of a computer simulation program written in FORTRAN to predict temperature variation across a 6" wafer for given lamp zone settings. The wafer can be either silicon or any other material as long as its thermophysical properties, i.e., thermal conductivity, specific heat capacity, and emissivity, are known. The final objective is to arrive at lamp zone power settings for any given process with minimal temperature nonuniformity. This simulation is based on low-order models.

Simple linear and parabolic intensity profiles have been assumed for the outer two zones, respectively. This has been assumed based on experimental results. From the published literature, it is inferred that a heat transfer coefficient increases as one moves towards to the edge of the wafer. Also, the heat transfer coefficient is assumed to be significantly higher at the gas flow inlet as the cold gas enters at the inlet and gets progressively warmer as it flows towards the outlet.

The simulation is based on finite difference method as the multilayered wafer is divided into 1350 volume elements based on polar coordinates (see FIG. 5 and FIG. 6). The heat balance EQ. (1) is solved for each volume element using an alternating implicit method from t=0 seconds for every 20 milliseconds to obtain temperature at every element. Thermal conductivity is assumed to be a function of temperature and calculated for every iteration. However, specific heat capacity is assumed to be constant. The wafer is essentially assumed to be "grey" so that a constant emissivity is used for temperature calculations.

Figure 8:
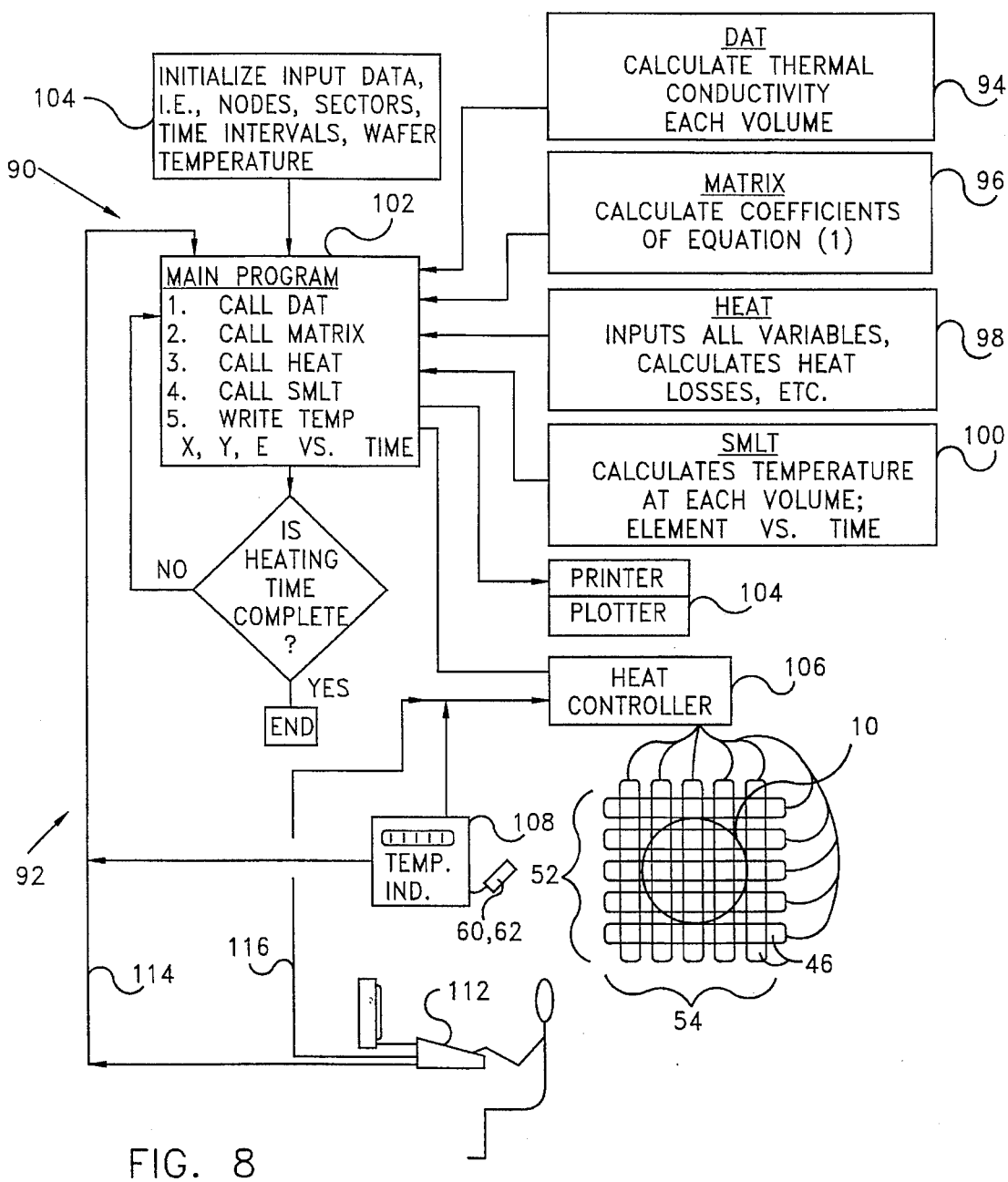
FIG. 8 is a computer program flow chart and heat control schematic diagram.

This program, as illustrated in the flow chart 90 and schematic diagram 92 in FIG. 8, has four subroutines:

1) Subroutine Dat:

This subroutine 94 calculates thermal conductivity for each volume element as a function of time. If the dependence of specific heat capacity on temperature is known for silicon, the subroutine is capable of calculating the specific heat capacity as a function of time.

2) Subroutine Matrix:

This subroutine 96 calculates the coefficients involved in the solution to the differential EQ. (1) and returns them to the main program.

3) Subroutine Heat:

This subroutine 98 forms the heart of the program by defining the system geometry, lamp settings, wafer-system geometry, lamp radiation as a function of time, i.e., ramp up, steady state, ramp up, steady state, etc., and the type of pattern present on the wafer. The program can also take into account the rotation of the wafer if rotation is desired.

The radiation is essentially assumed to be absorbed on the surface of the wafer. The heat intensity from the central lamp zones 3 and 8 (FIG. 5) reaching the wafer is assumed to be constant across the wafer surface lying below and above the lamps. The intensity from the outer zone falls off parabolically from edge to a line 2.5" away from the center. These assumptions were based on preliminary view factors review and experimental results.

Apart from the heat input directed towards the top and bottom surface, there is also a component of heat directed towards the edge of the wafer. For this reason, the wafer is conveniently divided into three sectors. The heat input consists of four components. Each sector receives about 33% of total intensity from three zones lying perpendicular to the wafer edge and 20% from the outermost zone lying tangentially to the wafer edge. The radiation losses, occurring at both top and bottom surfaces and edges of the wafer, are calculated. The convection losses, free as well as forced convection, are also calculated. The relative powers applied to the various lamp zones and the emissivity of the wafer are the primary inputs to this subroutine.

4) Subroutine SMLT:

This subroutine 100 calculates the temperature at each of the 1350 volume elements as a function of time.

Each of the above subroutines inputs to the main program 102 which also has initialization inputs 104. The main program: (1) determines thermophysical properties at each grid point; (2) determines a simultaneous equation for each grid point; (3) creates a matrix array to solve simultaneous equations for each grid point; (4) solves a tridiagonal matrix for temperature at each grid point; and (5) provides output to a printer/plotter 104 and heat controller 106 identifying temperature at each grid point (volume node) and energies as a function of time at each grid point.

The output can be used to control the energy inputs to each of the banks of heaters 1–5 as at 52 and 6–10 as at 54. The wafer temperature is monitored by pyrometers 60, 62 and fed back through the temperature indicator 108 to the main program or optionally providing a feedback to the heat controller 106. Another option is to have manual feedback by an operator 110 at an input terminal 112, wherein the operator can feedback to the main program as at 114 or feedback to the temperature indicator 108 as at 116.

Simulation Results

A. Oxidation of an Unpatterned Wafer without a Guard Ring

This process simulates a high-temperature oxidation process which is carried out in a sequence of two steps: one for 5 seconds at 750° C., and the other one at 46 seconds at 1100° C., as shown by the temperature versus time graph of FIG. 7. The target oxide thickness was about 100 Å. The ramp rate used in actual practice is 60° C. per second, but three different ramp rates were used (15° C., 60° C., and 250° C. per second) for this simulation.

Temperature variation across the 6" wafer was simulated at four different times of the entire cycle. One during the first ramp up stage to 750° C, the second during steady state at 750° C., a third during the ramp up to 1100° C., and the fourth one at 1100° C. The time taken to reach steady state and various times at which plots were taken for various ramp rates are given in TABLE I.

TABLE I

| PROCESS TIMES FOR DIFFERENT RAMP RATES | | | | | | |
|---|---|---|---|---|---|---|
| Ramp Rate (Deg/sec) | 1st Ramp Time (sec) | 2nd Ramp Time (sec) | Times at which Plots were Taken (sec) | | | |
| 15 | 50 | 23.33 | 35 | 50 | 60 | 100 |
| 60 | 12.05 | 5.83 | 9 | 14 | 20 | 40 |
| 250 | 2.88 | 1.4 | 1 | 5 | 9.5 | 20 |

The temperature variations across the 6" wafer were simulated for both the unoptimized, i.e., all the zone lamps operated at the same power level, and the optimized conditions, i.e., different zones operated at different power level. (See, TABLE II and FIG. 7.)

TABLE II

| LAMP POWER SETTING FOR OPTIMIZED PROCESS | | | | | | | | | | |
|---|---|---|---|---|---|---|---|---|---|---|
| | Zones/Percent | | | | | | | | | |
| Process Step | 1 | 2 | 3 | 4 | 5 | 6 | 7 | 8 | 9 | 10 |
| Ramp 1 | 80 | 90 | 100 | 90 | 80 | 77 | 77 | 100 | 77 | 77 |
| Steady 1 | 80 | 90 | 100 | 90 | 80 | 77 | 77 | 100 | 77 | 77 |
| Ramp 2 | 80 | 90 | 100 | 90 | 80 | 77 | 77 | 100 | 77 | 77 |
| Steady 2 | 80 | 90 | 100 | 90 | 80 | 77 | 77 | 100 | 77 | 77 |

FIG. 7 shows the simulated temperature of the center of the wafer as a function of time under open loop conditions but using variable intensities.

Figure 9A:
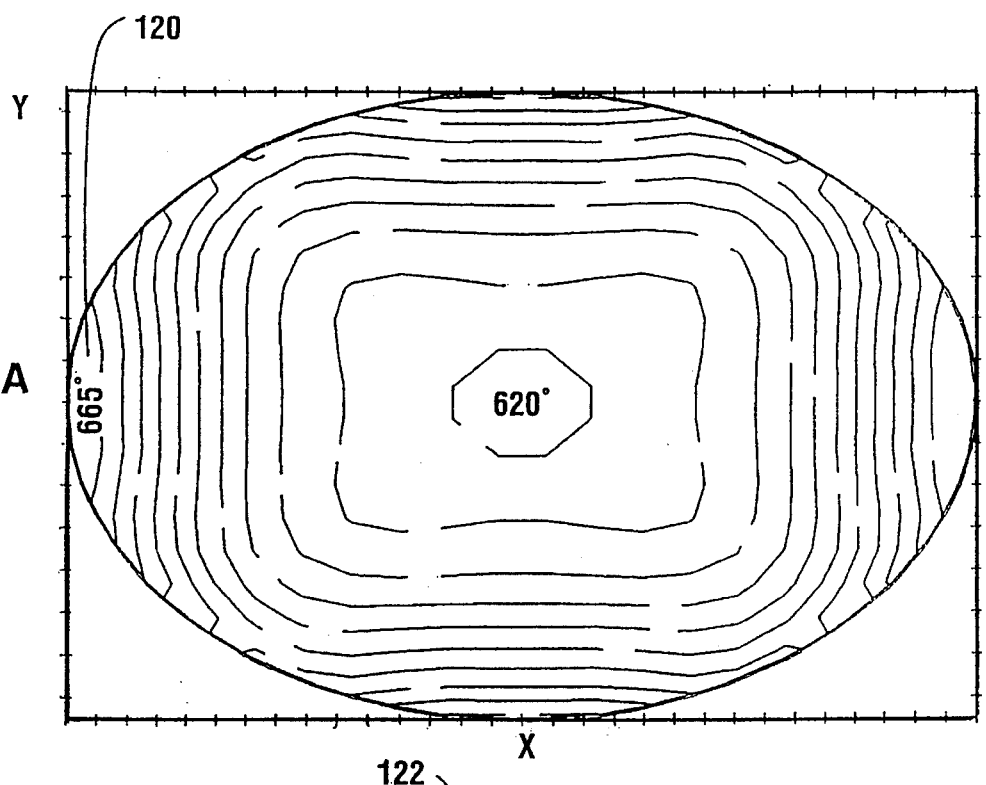
FIG. 9A–D is a temperature contour plot (Simulation A) on the X-Y axis of a circular 6" wafer for oxidation of an unpatterned wafer at four different times, using an unoptimized lamp heating program.
Figure 10A:
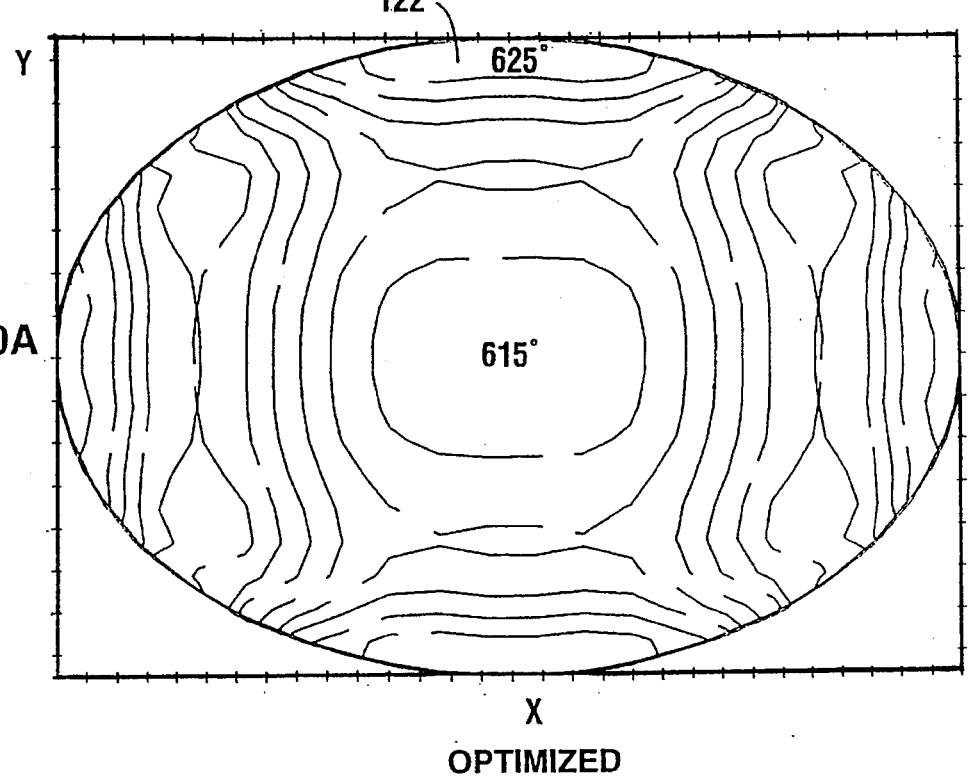
FIG. 10A–D is a similar temperature plot to 12A–D using an optimized lamp heating program.

FIG. 9A and 10A compare the simulated transient temperature profile across the wafer during a 60° C. per second ramp up stage to 750° C. occurring under the optimized (FIG. 10A) and unoptimized conditions (FIG. 9A), taken after 9 seconds. In all contour plots, the ±X axis is the abscissa and the ±Y axis is the ordinate. It can be seen that the edge of the wafer at 120 (FIG. 9A) is 45° C. above center temperature when the lamps operate at the same power level, whereas the edge is only 10° C. less at 122 (FIG. 10A) than the center temperature when power level to various zones are optimized. It is to be pointed that "optimized" in this context does not mean that the power levels to various zones are best configured, as the algorithm to achieve that is much more extensive and it would take longer periods of time. So, the relative intensities were actually assumed, and the resultant temperatures profiles were simulated and analyzed. Of various power configurations analyzed, the above one yielded one of the best temperature uniformity across the wafer.

Figure 9B:
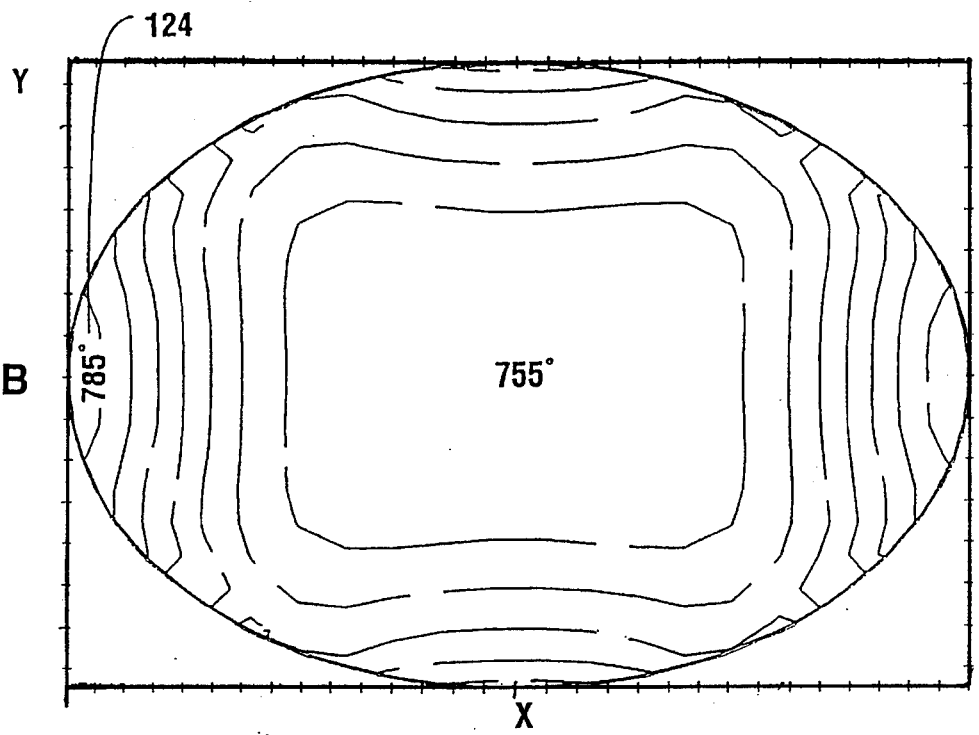
Figure 10B:
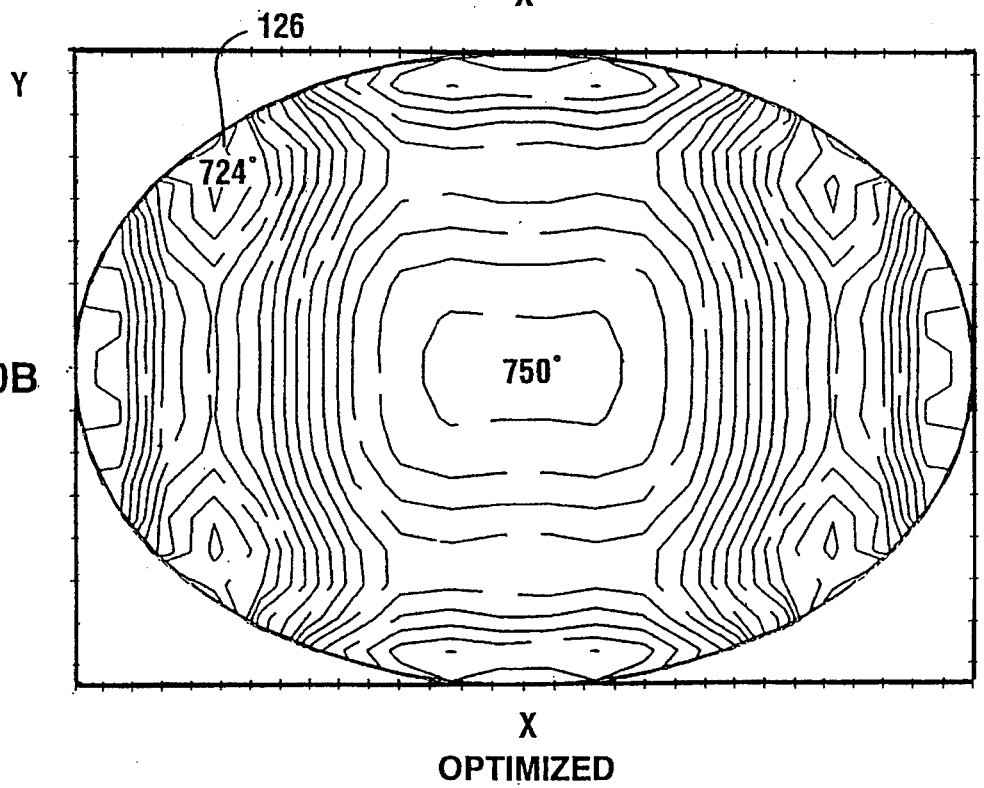

FIG. 9B and 10B highlight the importance of optimizing the zones as it compares the temperature profile taken across the wafer during the steady state at 750° C. for both optimized (FIG. 10B) and unoptimized (FIG. 9B) conditions taken after 14 seconds. The relative power settings to various zones during this stage, as it can be seen in TABLE II, were the same as the ones which were used during ramp up. When all the zones were operated at the same power level, the edge at 124 (FIG. 9B) was at temperature 30° C. above the center temperature. However, under optimized conditions, the edge at 126 (FIG. 10B) was only 26° C.

below the center temperature. However, as it was stated in the above section, there could be a relatively better setting to various zones which could further reduce the temperature nonuniformity across the wafer. It is also clear that the relative powers to be applied to various zones during ramp transients could be different from that during steady state at high temperatures. This stems from the observation that the edge of the wafer during ramp transient stage is still at a temperature higher than the center; so, if the power levels to the outer zones are reduced further, the edge temperature could be brought closer to the center temperature.

Figure 9C:
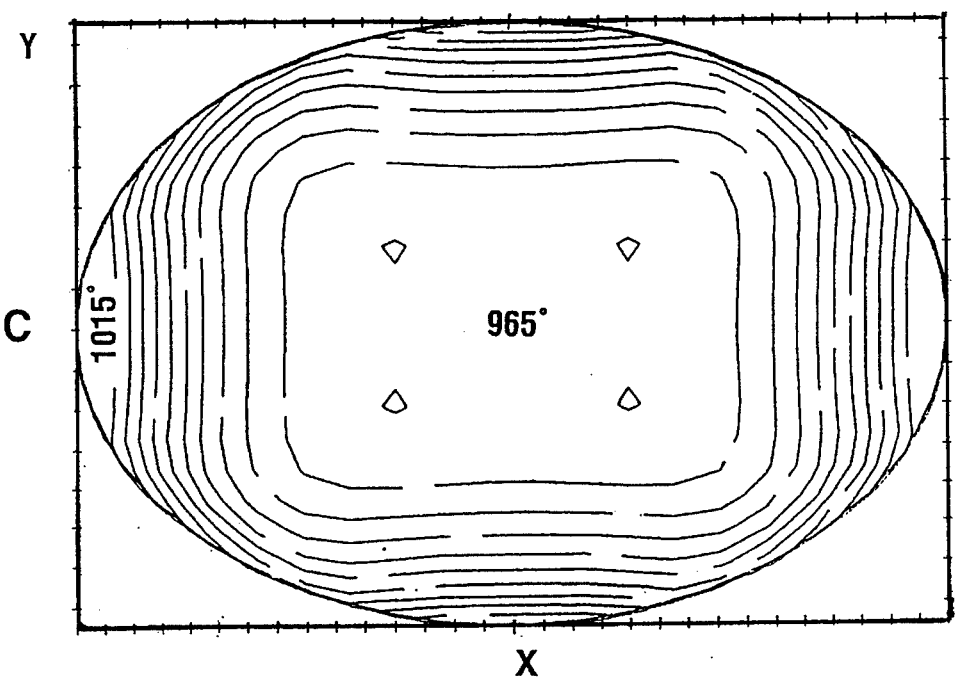
Figure 10C:
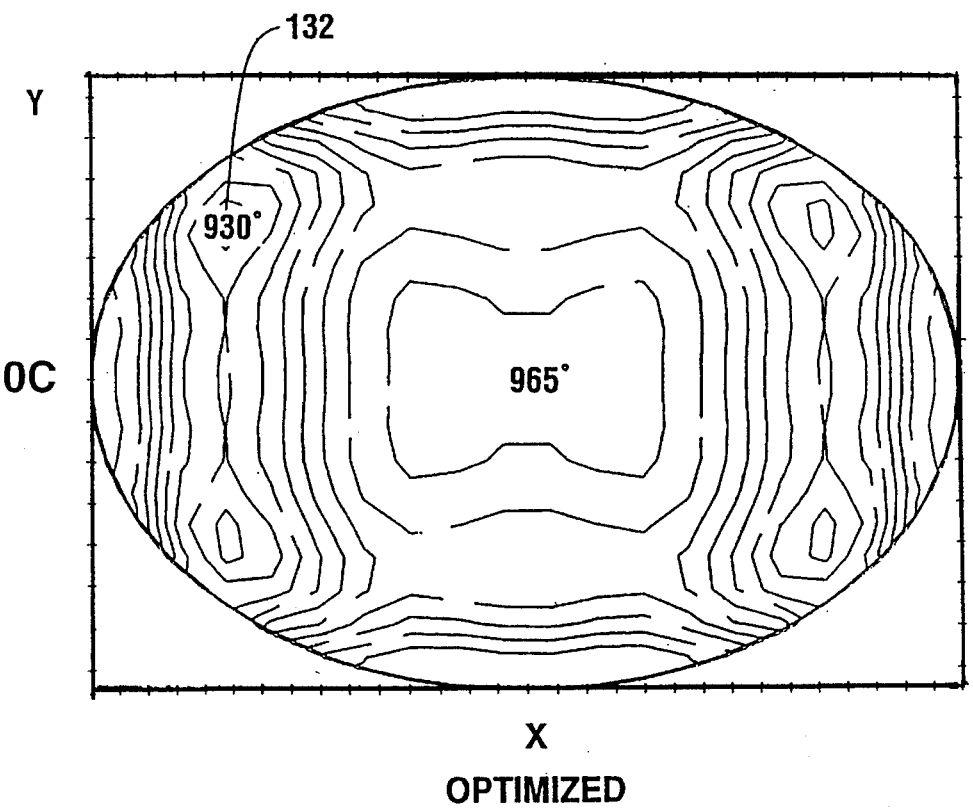
Figure 9D:
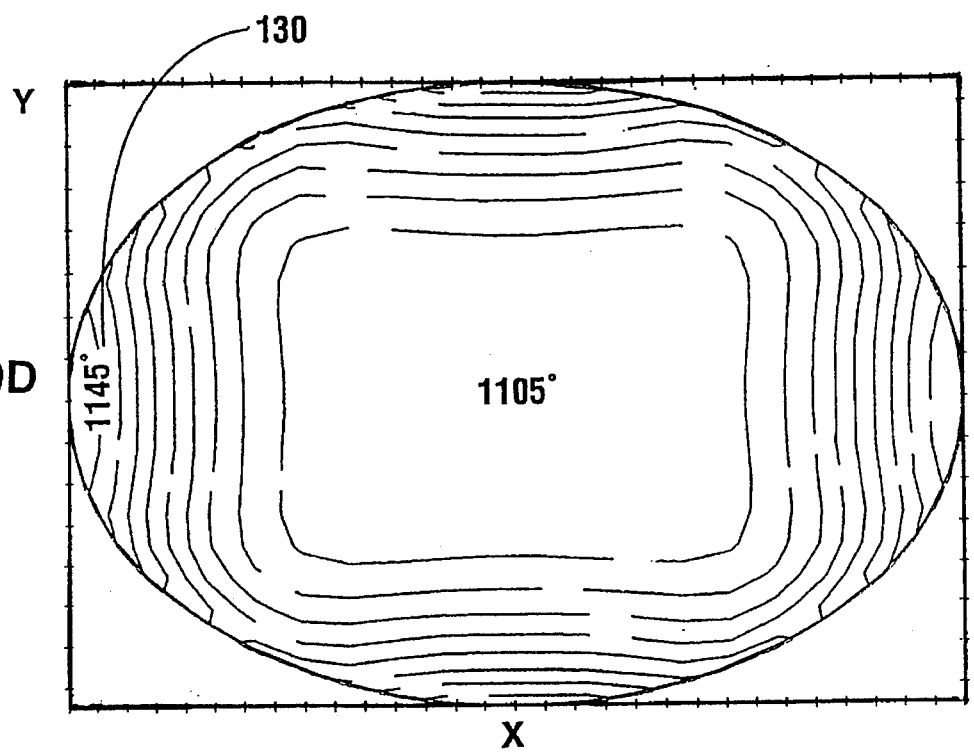
Figure 10D:
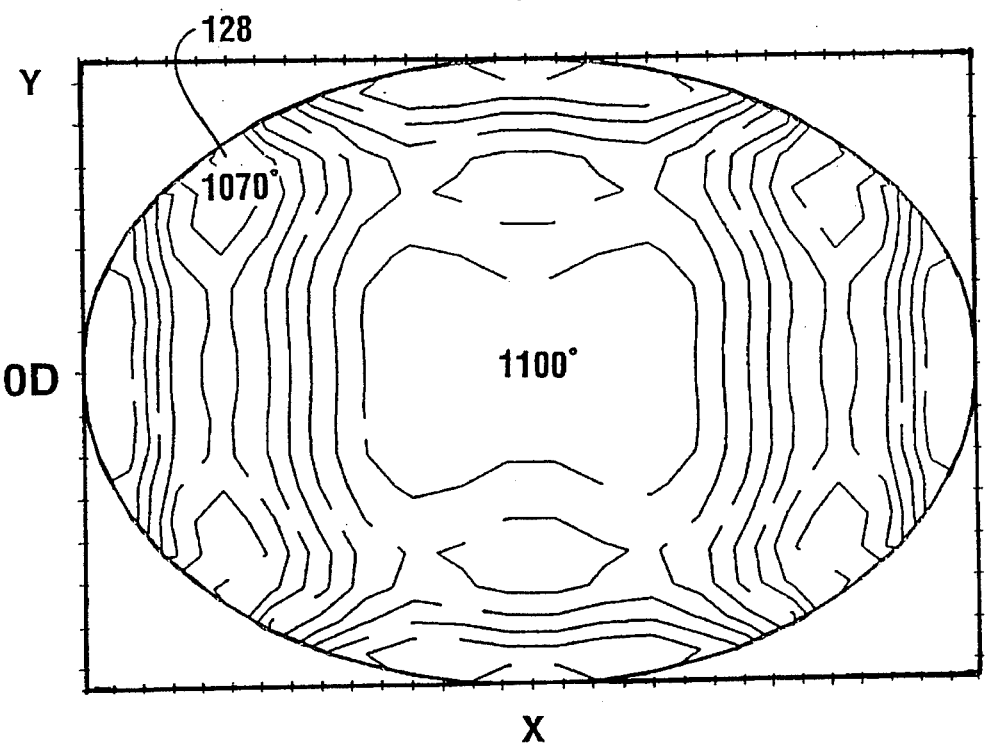

Similarly, FIG. 9C and 10C compare the temperature profiles across the wafer during the second 60° C. per second ramp-up stage under both unoptimized (FIG. 9C) and optimized (FIG. 10C) conditions, respectively, taken after 20 seconds. As seen from FIG. 10D and 9D, the temperature uniformity across the wafer during steady state at about 1100° C., the edge at 128 (FIG. 10D), is within 30° C. under optimized conditions, whereas the edge at 130 (FIG. 9D) is 40° C under unoptimized conditions. This is after 40 seconds. Again, it is clear that this value can be further brought down by a better configuration than assumed.

It can be seen in all these temperature profiles, a certain region closer to edge at 128 (FIG. 10D) and at 132 (FIG. 10C) shows temperatures considerably lower than the center and edge. This occurs due to the decoupling of central and the adjacent zones. This stems from the approximate intensity profiles assumed in our simulation program. Accurate intensity profiles can be determined only if a radiation view factor matrix is known for the system.

It should also be noted that the temperature profile across the wafer is not radially symmetric. This is due to the asymmetric heating lamp arrangement of the RTP system used, i.e., AG 8108. One way to reduce this type of nonuniformity would be to rotate the wafer during processing. This might require wafer heating from one side only, i.e., top side only. Simulation of temperature profiles across a rotating wafer are discussed in the later section.

B. Effect of Ramp Rate on Temperature Nonuniformity

Temperature profiles across the wafer were simulated for ramp rates of 15° C. per second and 250° C. per second to study their effect on temperature nonuniformity both during transient and steady state.

Figure 11:
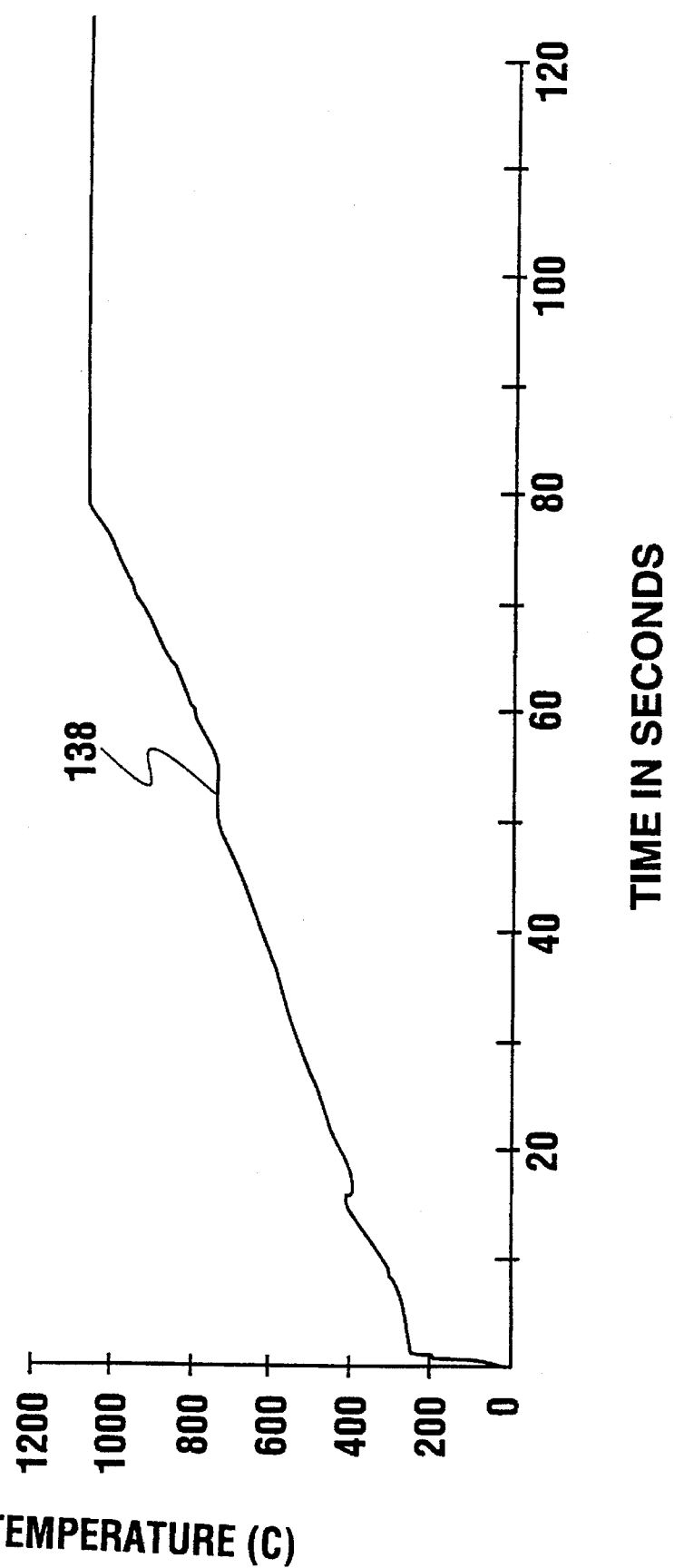
FIG. 11 is a graph of wafer temperature versus time (Simulation B) using a ramp rate of 15° C. per second on an unpatterned wafer.
Figure 12:
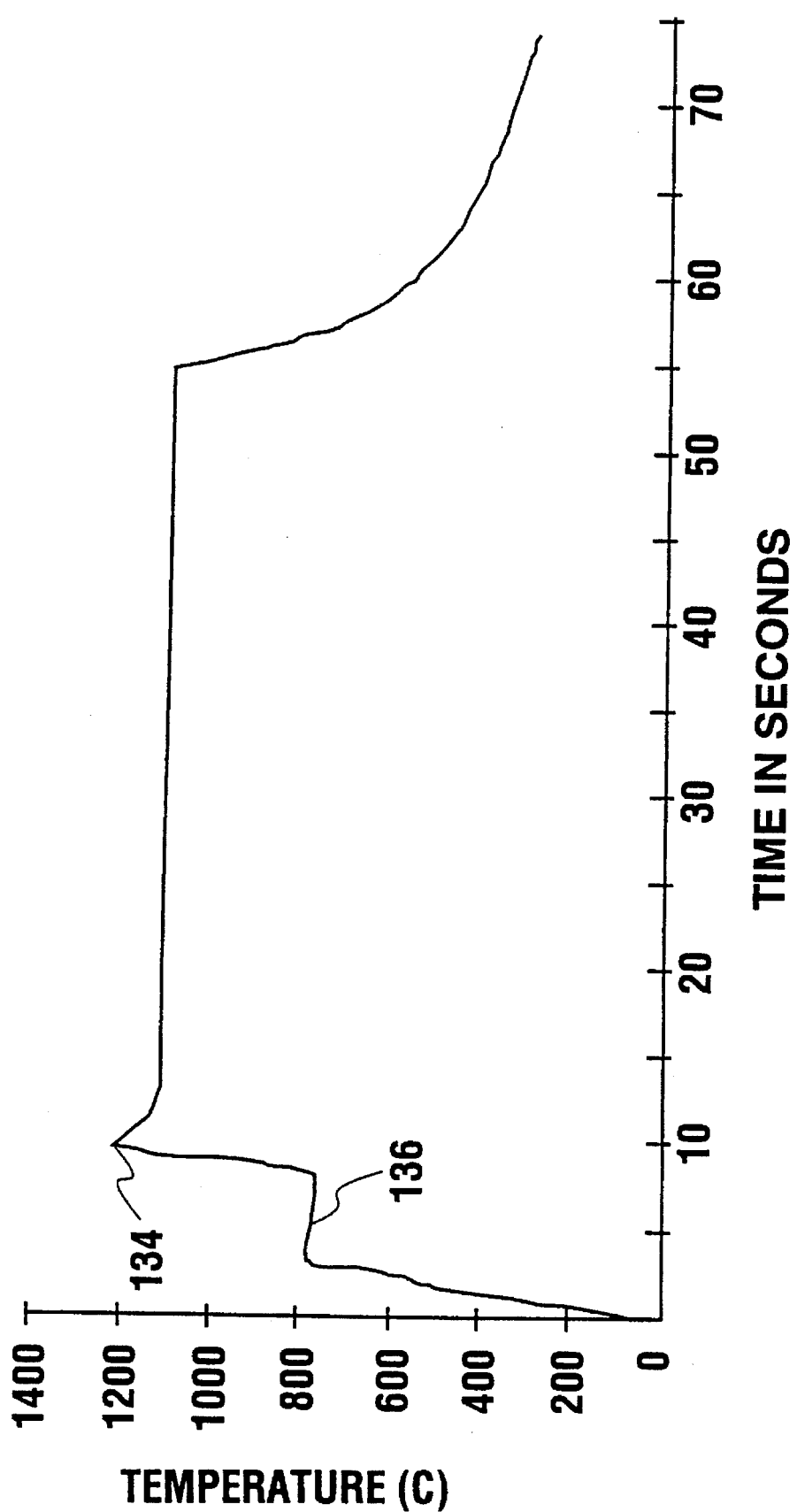
FIG. 12 is a graph of wafer temperature versus time using ramp rate of 250° C. per second on the unpatterned wafer.

FIG. 11 and FIG. 12 show the temperature of the wafer center varying with time for 15° C. per second and 250° C. per second ramp up, respectively. As expected, one can see the temperature overshoot at the end of second ramp-up period at 134 (FIG. 12) in the latter case. This is due to the reduced time (3 seconds at 136, FIG. 12) allowed for thermal relaxation to occur, as compared to about 7 seconds at 138 of FIG. 11.

The data from the heat-up rates of FIG. 11 and 12 show that the temperature nonuniformity across the wafer remain about the same when the ramp rate is decreased from 60° C. per second to 15° C. per second under otherwise identical conditions, i.e., the temperature nonuniformity remains about 30° C. However, when the ramp rate is increased to 250° C. per second as in FIG. 12, the data indicates that the temperature nonuniformity gets worse not only during transient stage, but also during steady state if it lasts only a couple of seconds (say less than 10 seconds). This temperature difference was about 35° C. Also, the final temperatures are 40° C. indicated a difference. This should be expected because with increased ramp rates, less thermal relaxation due to thermal conduction occurs. Hence, optimized power setting not only depends on the processing temperature and time but also on the ramp rate.

C. A Thin Layer of Titanium on Silicon

The emissivity and absorption characteristics of titanium are considerably different from silicon. So it absorbs more radiation than silicon for the same lamp power, and it also emits more radiation than silicon at the same temperature. This radiation phenomena is significant only at considerably elevated temperatures, i.e., above 900° C. Hence, it can be expected that the wafer will exhibit temperatures higher than bare silicon wafer for the same lamp intensity at temperatures below 900° C. and a temperature lower than a bare silicon wafer at temperatures above 900° C.

The simulation was done using the same relative lamp power settings used in the previous section. Of course, one is not normally interested in heating titanium to temperatures as high as 1100° C. This simulation was primarily done to check the effect to thermophysical properties (thermal conductivity, absorption coefficient, emissivity) on temperature nonuniformity across the wafer.

Figure 13:
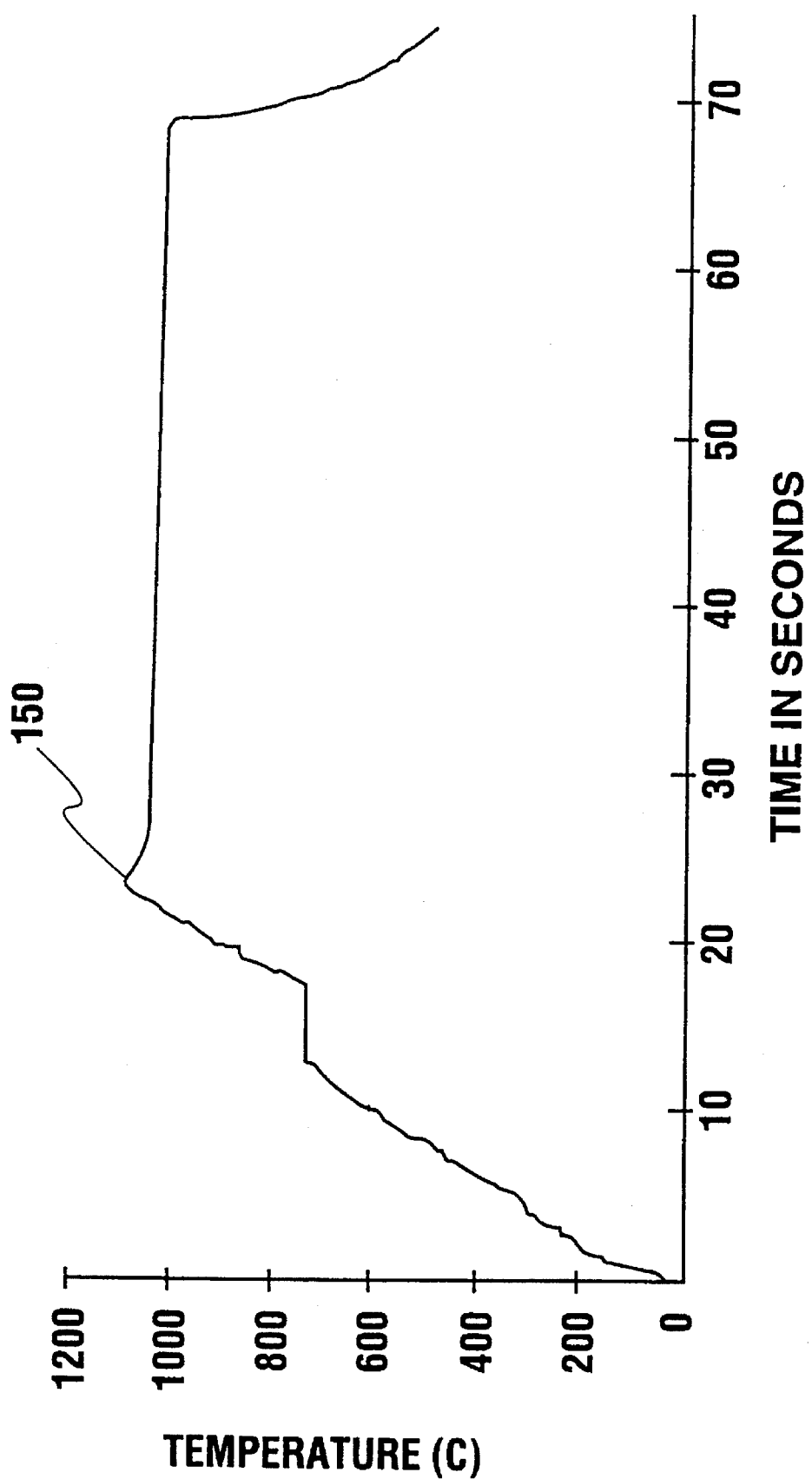
FIG. 13 is a graph of a titanium-coated-wafer temperature versus time (Simulation C) using a ramp rate of 60° C. per second.

FIG. 13 shows the temperature of the titanium coated wafer center varying with time and having a mild overshoot at 150 at a rate of 60° C. per second.

The resulting temperatures were not much different from those profiles exhibited by bare silicon wafer, except that the overall temperature seems to be slightly lower than that attained by bare silicon wafer, i.e., 1085° C., or the same level of intensity used for bare silicon wafer as the radiation effects become dominant at high temperatures. Hence, during thermal treatment of any layer whose thermophysical properties are comparable to that of titanium, one needs to apply decreased power to the lamps compared to bare silicon wafer at lower temperatures and increased power at higher temperatures. Temperature nonuniformity was about 40° C.

D. Simulation of Temperature Profile Across a Rotating Wafer

As discussed at the end of section A, one solution to eliminate temperature nonuniformity across the wafer processed in a linear lamp array system would be to rotate the wafer during processing.

Figure 14:
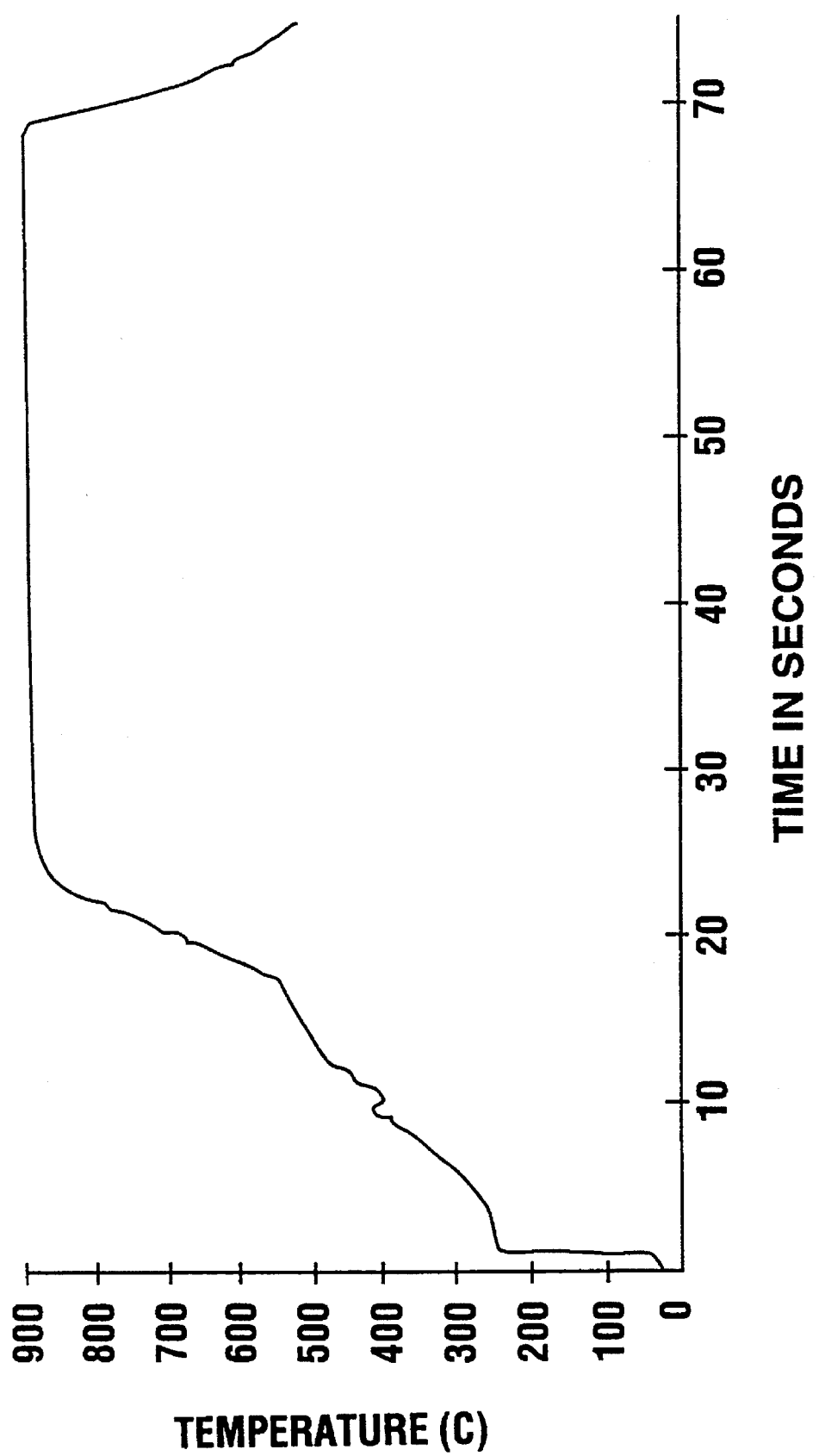
FIG. 14 is a graph of a rotated wafer temperature versus time (Simulation D) heating one side and at a ramp rate of 60° C. per second.

FIG. 14 shows the temperature profile of the wafer versus time under one-sided heating conditions and rotation. So, effectively, the intensity applied to the wafer is half the intensity applied in previous sections. The relative power setting to various zones is the same one as used in the previous section.

The temperature profile across the wafer was simulated for three different rotational speeds at 9, 14, 20, and 40 seconds, i.e., 10, 30, and 60 revolutions per minute (RPM), to see the effect of RPM on temperature nonuniformity. As expected, the temperature profiles become more radially symmetric with increased speed of rotation. The data indicated that above a certain RPM temperature profile doesn't change much. This is again expected, as the time interval at which any part of the wafer is exposed to a particular region of heating arrangement will saturate with increasing RPM. It could be as low as 30 RPM.

Hence, these simulations suggest that the radial symmetry of the temperature profile across the wafer gets better when the wafer is rotated. The temperature differences in each final steady-state case were about 12° C. at all three RPMs.

E. Patterned Wafer

The above sections dealt with unpatterned wafers. But, in practice, one often deals with patterned wafers, where a patterned layer of another material whose thermophysical properties are considerably different from silicon, is present on silicon wafer or a wafer having multiple masking levels. Hence, the simulation of temperature profile across the patterned silicon wafer would be most important from an industrial point of view.

The patterned material considered here was titanium. Simulation was done for a plain chess square pattern of two different sizes: 5×5 mm and 10×10 mm. The data indicated that temperature nonuniformity in both the larger and smaller sizes look like the profiles of the unpatterned titanium of section C above. Consequently, the optimized setting to be used to achieve better temperature uniformity also depends on the pattern size.

F. Experimental Results from Oxidation

A final experiment was performed to carry out oxidation of a wafer in an oxygen atmosphere under various lamp configurations to verify the mathematical models. Oxidation was carried out on stripped wafers which have a native oxide less than 10 Å. One set of experiments was carried out with a thermal guard ring and the other without a guard ring. The former one was carried out mainly to guide us in incorporating the ring in the program. The latter set of experiments were carried out to test our models. The flow rate of oxygen was about 3 standard liters per minutes (SLPM). The oxidation was carried out at 1150° C. and the thermal cycle has an intermediate step at 750° C.

The oxidation experiment would be similar to the computer simulation of example A and FIG. 7 and FIG. 10A–D.

The results are as follows:

TABLE III

PROCESS CONDITIONS WITH A GUARD RING

| Exp. No. | Lamp Zone Power Setpoint % | | | | | | | | | | Open Loop |
|---|---|---|---|---|---|---|---|---|---|---|---|
| | 1 | 2 | 3 | 4 | 5 | 6 | 7 | 8 | 9 | 10 | |
| 1 | 97 | 93 | 100 | 95 | 98 | 77 | 73 | 100 | 73 | 90 | Y |
| 2 | 100 | 100 | 100 | 100 | 100 | 100 | 100 | 100 | 100 | 100 | Y |
| 3 | 100 | 0 | 0 | 0 | 100 | 0 | 0 | 0 | 0 | 0 | Y |
| 4 | 100 | 100 | 0 | 100 | 100 | 0 | 0 | 0 | 0 | 0 | Y |
| 5 | 0 | 100 | 0 | 100 | 0 | 0 | 100 | 0 | 100 | 0 | Y |
| 6 | 100 | 0 | 0 | 0 | 100 | 100 | | | | 100 | Y |
| 7 | 0 | 100 | 100 | 100 | 0 | 0 | 100 | 100 | 100 | 0 | Y |
| 8 | 0 | 0 | 100 | 0 | 0 | 0 | 0 | 100 | 0 | 0 | Y |
| 9 | 0 | 0 | 0 | 0 | 0 | 100 | 0 | 0 | 0 | 100 | Y |
| 10 | 0 | 100 | 0 | 100 | 0 | 0 | 0 | 0 | 0 | 0 | Y |
| 11 | 0 | 0 | 0 | 0 | 0 | 0 | 100 | 0 | 100 | 0 | Y |
| 12 | 100 | 100 | 100 | 100 | 100 | 100 | 100 | 100 | 100 | 100 | N |
| 13 | 0 | 100 | 100 | 100 | 0 | 0 | 100 | 100 | 100 | 0 | N |
| 14 | 97 | 93 | 100 | 95 | 98 | 77 | 73 | 100 | 73 | 90 | N |

TABLE IV

RESULTS FROM EXPERIMENTS WITH A GUARD RING

| Exp. No. | Highest reported temperature, °C. | Oxidation Thickness, Å | | | | Std. Dev (%) |
|---|---|---|---|---|---|---|
| | | Range | Mean | Min. | Max. | |
| 1 | 1090 | 7 | 77 | 73 | 80 | 4.8 |
| 2 | 1128 | 10 | 102 | 95 | 105 | 2.72 |
| 3 | 200 | 3 | 13 | 11 | 14 | 2.15 |
| 4 | 665 | 6 | 16 | 13 | 19 | 4.67 |
| 5 | 768 | 6 | 19 | 15 | 21 | 3.94 |
| 6 | 474 | 4 | 14 | 12 | 16 | 2.91 |
| 7 | 1036 | 6 | 47 | 44 | 50 | 3.89 |
| 8 | 806 | 2 | 19 | 18 | 20 | 1.73 |
| 9 | 200 | 3 | 14 | 13 | 16 | 2.19 |
| 10 | 439 | 3 | 15 | 13 | 16 | 2.65 |
| 11 | 441 | 3 | 15 | 13 | 16 | 2.36 |
| 12 | 1150 | 13 | 125 | 116 | 129 | 7.11 |
| 13 | 1137 | 14 | 94 | 85 | 99 | 9.97 |
| 14 | 1150 | 8 | 122 | 117 | 125 | 6.31 |

TABLE V

EXPERIMENTAL CONDITIONS WITHOUT A GUARD RING

| Exp. No. | Lamp Zone Power Setpoint % | | | | | | | | | | Open Loop |
|---|---|---|---|---|---|---|---|---|---|---|---|
| | 1 | 2 | 3 | 4 | 5 | 6 | 7 | 8 | 9 | 10 | |
| 15 | 97 | 93 | 100 | 95 | 98 | 77 | 73 | 100 | 73 | 90 | Y |

TABLE V-continued

EXPERIMENTAL CONDITIONS WITHOUT A GUARD RING

| Exp. No. | Lamp Zone | | | | | | | | | | Open Loop |
|---|---|---|---|---|---|---|---|---|---|---|---|
| | 1 | 2 | 3 | 4 | 5 | 6 | 7 | 8 | 9 | 10 | |
| | Power Setpoint % | | | | | | | | | | |
| 16 | 100 | 100 | 100 | 100 | 100 | 100 | 100 | 100 | 100 | 100 | Y |
| 17 | 0 | 100 | 100 | 100 | 0 | 0 | 100 | 100 | 100 | 0 | Y |
| 18 | 80 | 90 | 100 | 90 | 80 | 77 | 77 | 100 | 77 | 77 | Y |
| 19 | 77 | 92 | 100 | 92 | 77 | 72 | 80 | 100 | 80 | 72 | Y |

TABLE VI

EXPERIMENTAL RESULTS FROM THE EXPERIMENTS WITHOUT A GUARD RING

| Exp. No. | Highest reported temperature, °C. | Oxidation Thickness, Å | | | | Std. Dev (%) |
|---|---|---|---|---|---|---|
| | | Range | Mean | Min. | Max. | |
| 15 | 1112 | 8 | 91 | 86 | 94 | 6.67 |
| 16 | 1147 | 15 | 116 | 105 | 120 | 8.42 |
| 17 | 1050 | 10 | 53 | 47 | 57 | 7.06 |
| 18 | 1100 | 10 | 81 | 74 | 84 | 6.81 |
| 19 | 1097 | 10 | 81 | 74 | 84 | 7.46 |

A 49-point oxidation thickness analysis of experiment 6 showed the oxide thickness near the edge of the wafer to be high compared to the center. This correlates well with the simulation in previous sections where we saw the edges to be at a higher temperature when all the zones were operating at the same power level. The 49-point oxidation analysis showed that the oxide thickness near the edge of the wafer to be only 2 Å more than the center. This, too, agrees with the simulation.

The best mode in the above tests at 1100° C. (experiments 12–14) is the experiment that results in the lowest standard deviation of thickness. For the process with the guard ring experiment, experiment 14 has the lowest standard deviation. The lamp zone setting used was lower on the outer zones and higher on the middle zones, i.e., zones 3 and 8.

For the process without the guard ring at 1100° C. (experiments 16–19), the best mode was experiment 15, which used the same zone lamp settings as experiment 14 above, again demonstrating the value of presetting heat intensities by computer simulation before trials.

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims.

What is claimed is:

1. A rapid thermal process for presetting and controlling a lamp heating system used to heat a semiconductor wafer, the process comprising:

a) initializing input data to a computer main program, the input data including indicia relating to the lamp heating system and properties of the semiconductor wafer;

b) calculating an expected temperature for a plurality of three-dimensional wafer volume elements versus time, responsive to the input data indicia;

c) individually controlling a power level to multiple lamp banks, the power level being controlled, directly or indirectly, by the computer main program responsive to the expected temperature calculated for the volume elements to provide a predetermined temperature ramp rate and steady state level for minimal wafer temperature nonuniformity;

d) monitoring the wafer temperature with a temperature sensor;

e) providing a temperature feedback from the temperature sensor to, selectively, one of a heat controller and the computer main program, thereby providing for quick and accurate controlling of the wafer temperature.

2. The process as recited in claim 1 further including controlling the temperature during oxidation of an unpatterned wafer.

3. The process as recited in claim 1 further including controlling the temperature during heating of a wafer having a thin layer of metal on a silicon substrate.

4. The process as recited in claim 3 wherein the thin layer of metal is titanium.

5. The process as recited in claim 1 further including controlling the temperature during heating of a rotating wafer.

6. The process as recited in claim 5 wherein the wafer is rotating at about 5–30 RPM.

7. The process as recited in claim 1 further including controlling the temperature during heating of a patterned wafer having multiple masking levels.

8. The process as recited in claim 1 further including controlling the temperature during heating and oxidation of an unpatterned wafer having a thermal guard ring surrounding the wafer.

9. The process as recited in claim 8 wherein a thermal cycle has an intermediate step at about 750° C. and a final temperature at about 1100° C.

10. The process as recited in claim 9 wherein the lamp banks in an outer zone are set at a lower power than the lamp banks in an inner zone, and the temperature ramp rate is about 15° C. per second.

11. The process as recited in claim 1 further including controlling the temperature during heating of a multilayered wafer.

12. The process of claim 1 wherein initializing the input data to a computer main program further comprises:

a) inputting a thermal conductivity for a wafer volume element as a function of time;

b) inputting a plurality of coefficients used in a differential heat equation for a wafer temperature; and c) defining system variable parameters and calculating heat losses.

13. A computer control system for presetting and controlling a heat lamp input to heat a semiconductor wafer, the system comprising:

a) a main computer and computer program having input data, the input data including indicia relating to the heat lamp and properties of the semiconductor wafer;

b) means for calculating an expected temperature for a plurality of three-dimensional wafer volume elements versus time, responsive to the input data indicia;

c) a heat controller having an input signal from, selectively, one of a temperature indicator and the main computer;

d) a multiple zoned lamp bank having a power input from the heat controller;

e) a pyrometer and the temperature indicator having temperature input from the wafer; and, f) a temperature feedback means for feeding back temperature data from the temperature indicator to, selectively, one of the heat controller and main computer, wherein the main computer outputs time, temperature, wafer X and Y coordinates for the volume elements, and heat intensity to preset and control the lamp bank power input.

14. The computer control system of claim 13 further including:

a) a means for calculating thermal conductivity and specific heat capacity as a function of time;

b) a means for calculating a plurality of differential equation coefficients; and, c) a means for defining multiple input variables.

15. The computer control system of claim 13 wherein the input data indicia further comprises, selectively:

a) system geometry;

b) lamp settings;

c) wafer geometry;

d) lamp radiation as a function of time;

e) single-side heating;

f) wafer rotation;

g) emissivity;

h) thermophysical properties; and, i) thermochemical properties.

16. The computer control system of claim 13 wherein the multiple-zoned lamp bank further comprises a central zone and outer zone above and below the wafer, said outer zone power input being less than the central zone, thereby preventing overheating of a wafer edge.

17. The computer control system of claim 16 wherein the temperature feedback means is a temperature indicator output to the heat controller and to the main computer.

18. The computer control system of claim 13 wherein the multiple-zone lamp bank is in a ring configuration.

19. The computer control system of claim 13 wherein the multiple lamp banks comprise a series of lamp banks above the wafer and a series of lamp banks below the wafer.

* * * * *